United States Patent
Fujimoto et al.

(10) Patent No.: US 6,897,006 B2
(45) Date of Patent: May 24, 2005

(54) MULTILAYERED PHOTOSENSITIVE MATERIAL FOR FLEXOGRAPHIC PRINTING PLATE

(75) Inventors: Takashi Fujimoto, Yokohama (JP); Norio Seki, Sagamihara (JP); Toshiya Takagi, Fujisawa (JP); Katsuyuki Ohta, Atsugi (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 311 days.

(21) Appl. No.: 09/858,589

(22) Filed: May 17, 2001

(65) Prior Publication Data

US 2001/0053498 A1 Dec. 20, 2001

(30) Foreign Application Priority Data

May 17, 2000 (JP) ........................................ 2000-145273

(51) Int. Cl.⁷ ............................. G03F 7/095; G03F 7/11
(52) U.S. Cl. ..................................................... 430/273.1
(58) Field of Search ..................................... 430/273.1

(56) References Cited

U.S. PATENT DOCUMENTS

| | | | | |
|---|---|---|---|---|
| 3,458,311 A | * | 7/1969 | Alles ........................ | 430/273.1 |
| 4,148,658 A | | 4/1979 | Kondoh et al. ............ | 96/115 P |
| 4,177,074 A | * | 12/1979 | Proskow .................... | 430/286.1 |
| 4,361,640 A | * | 11/1982 | Pine .......................... | 430/278.1 |
| 4,419,438 A | * | 12/1983 | Etoh et al. ................. | 430/275.1 |
| 4,442,302 A | * | 4/1984 | Pohl .......................... | 204/159.23 |
| 4,517,279 A | * | 5/1985 | Worns ....................... | 430/286.1 |
| 4,855,212 A | * | 8/1989 | Tate et al. ................. | 430/281.1 |
| 5,262,275 A | | 11/1993 | Fan ........................... | 430/273.1 |
| 5,607,814 A | | 3/1997 | Fan et al. .................. | 430/273.1 |
| 5,994,032 A | | 11/1999 | Goffing et al. ............ | 430/273.1 |
| 6,020,108 A | | 2/2000 | Goffing et al. ............. | 430/306 |

FOREIGN PATENT DOCUMENTS

| | | | |
|---|---|---|---|
| EP | 0 741 330 | | 11/1996 |
| GB | 1441339 | * | 6/1976 |
| JP | 47-31705 | | 11/1972 |
| JP | 62-11851 | | 1/1987 |
| WO | 94/03838 | | 2/1994 |
| WO | 96/16356 | | 5/1996 |

OTHER PUBLICATIONS

Cadogan et al, "Plasticizers, Abstract (1 page)","2. Types of Plasticizers (5 pages)", from www.mrw.interscience.wiley-.com/kirk/articles/pascado.a01, Kirk–Othmer Encyclopedia of CHemical Technology, copyright 199 by John Wiley & Sons, Inc.*

* cited by examiner

Primary Examiner—Cynthia Hamilton
(74) Attorney, Agent, or Firm—Wenderoth, Lind & Ponack, L.L.P.

(57) ABSTRACT

The invention discloses a multilayered photosensitive material for processing into a flexographic printing plate by direct patterning with an infrared laser beam. The multilayered material comprises: (A) a substrate; (B) a photosensitive resinous layer having sensitivity to light excepting infrared light and comprising (b1) an elastomeric binder resin, (b2) a polymerizable monomeric compound and (b3) a polymerization initiator formed on the substrate (A); (C) a barrier layer of a composition comprising a resin such as a polyvinyl pyrrolidone and alkali-soluble cellulose compounds, which transmits light other than infrared light and is removable in the development treatment, formed on the photosensitive resinous layer (B); and (D) a masking layer of a composition comprising (d1) a film-forming binder resin, (d2) an infrared absorbing compound and (d3) a compound having no transmissivity to lights other than infrared light and removable by irradiation with an infrared laser beam, formed on the barrier layer (C).

15 Claims, No Drawings

MULTILAYERED PHOTOSENSITIVE MATERIAL FOR FLEXOGRAPHIC PRINTING PLATE

BACKGROUND OF THE INVENTION

The present invention relates to a multilayered photosensitive material for the preparation of a flexographic printing plate or, more particularly, to a multilayered photosensitive material for the preparation of a flexographic printing plate which is suitable for direct plate making by direct image writing with an infrared laser beam.

When a flexographic printing plate is prepared by utilizing the photolithographic technology, it is usual to employ a multilayered photosensitive material prepared by successively forming a layer of a photosensitive resinous composition and an oxygen-shielding layer on the surface of a substrate. Along with the progress of electronic devices in recent years, it is now possible also in the field of the printing technology to undertake a computerized general control of the overall process involving inputting and compilation of the printing materials, proof reading and plate making so that the direct plate-making method is highlighted in which a flexographic printing plate can be prepared directly from digital data of the printing materials.

The direct plate-making method, which is also called the CTP (computer-to-plate) method, is advantageous over the conventional plate-making method utilizing a negative transparency because, as a result of direct plate making from digital data, correction of the printing images can be conducted by correcting the computer-recorded digital data without necessitating re-preparation of a corrected negative transparency so that the time, labor and cost for the preparation of a completed printing plate can be greatly decreased.

While several variations are proposed for the direct plate-making method, a method is proposed as the most promising in which the patterned image is formed in a masking layer formed on a printing plate having a photosensitive resinous layer and the printing plate is prepared by utilizing the patterned image in the masking layer because this method has best adaptability as an extension of the conventional photolithographic method.

A most versatile procedure for practicing the above mentioned prior art for plate making is that the masking layer is patternwise removed by melting with irradiation of a laser beam. This procedure, however, has problems that, in the patternwise removal of the masking layer by melting, the photosensitive resinous layer is adversely influenced by the laser beam and that the polymerizability of the photosensitive resinous layer is decreased by the atmospheric oxygen acting as a polymerization inhibitor because the photosensitive resinous layer after removal of the masking layer by melting is protected only insufficiently.

The above-mentioned phenomena result in degradation of the quality of the flexographic printing plate because the shoulder portion of the patterned resinous layer of the printing plate is rounded due to inhibition of the polymerization reaction in the resinous layer by the atmospheric oxygen to increase the dot gain in printing.

As a countermeasure to this problem, Japanese Patent Kokai 62-11851 proposes a method in which the waxy compound in the photosensitive resinous layer is contained in a gradient distribution of the concentration so as to decrease the influence of the atmospheric oxygen in printing plate preparation. This method, however, is not practicable due to insufficient barrier effect of the layer against oxygen.

Alternatively, Japanese Patent Kokai 47-31705 and 53-69284 propose a method in which the photosensitive resinous layer is shielded against the atmospheric oxygen by providing a separate barrier layer on the surface thereof. This method, however, has a defect that, with the barrier layers thus far employed, the patterned resinous layer of the flexographic printing plate obtained by development has a poor cross sectional profile.

Further, according to a method disclosed in International Publication 94/3838, patterning of the resinous layer is conducted by using a photosensitive material having a multilayered structure comprising a substrate, a photosensitive flexographic layer, a shielding layer and an infrared-sensitive layer transmitting no chemical rays followed by removal of the masking layer by melting with an infrared laser beam. This method, however, is defective because second ultraviolet exposure cannot be undertaken or the exposure time must be extended in the presence of the atmospheric oxygen.

SUMMARY OF THE INVENTION

The present invention accordingly has an object, by overcoming the problems and disadvantages in the conventional flexographic printing plates, to provide a multilayered photosensitive material for the preparation of a flexographic printing plate which exhibits a high oxygen-shielding effect not to cause rounding in the shoulder portions of the patterned resinous layer produced by the direct plate-making procedure so as to accomplish high quality of printing with good durability in printing.

Thus, the multilayered photosensitive material for the preparation of a flexographic printing plate provided by the present invention comprises, as an integrally laminated body:

(A) a substrate having flexibility;
(B) a layer, formed on the substrate, of a photosensitive resinous composition comprising (b1) an elastomeric binder resin, (b2) a polymerizable monomeric compound and (b3) an infrared-insensitive polymerization initiator for the monomeric compound (b2);
(C) a barrier layer, formed on the photosensitive resinous layer (B), of a polyvinyl pyrrolidone or an alkali-soluble cellulose compound having transmissivity to non-infrared light; and
(D) a masking layer, formed on the barrier layer (C), of a composition comprising (d1) a film-forming binder resin, (d2) an infrared absorbing agent and (d3) a non-infrared light shielding compound.

The above-mentioned non-infrared light includes visible light, electromagnetic waves having a wavelength shorter than visible light such as ultraviolet light and electromagnetic waves having a wavelength longer than microwaves.

DETAILED DESCRIPTION OF THE PREFERRED EMBODIMENTS

Various kinds of sheet materials having flexibility can be used as the substrate (A) in the inventive photosensitive material provided that the sheet material has mechanical strengths and physical properties capable of withstanding to the printing conditions with the flexographic printing plate including metal sheets, plastic films and paper sheets as well as composite sheets thereof. Particular examples of suitable substrate materials include films of a polymeric resin formed by an addition polymerization reaction or linear polycondensation reaction, woven and non-woven fabrics such as glass fiber cloths and foils of a metal such as steels and aluminum. Since the substrate should desirably be transparent to non-infrared lights, films of a polyethylene resin and polyester resin are preferred, of which films of a polyethylene terephthalate resin are more preferable. The thickness of the substrate is in the range from 50 to 300 μm or, preferably, from 75 to 200 μm.

It is optional according to need that the substrate surface is coated with a primer composition for improving adhesion of the photosensitive resinous layer formed on the substrate. Examples of the primer composition include mixtures of an acrylic resin and a polyisocyanate compound.

The photosensitive resinous layer (B) formed on the substrate surface, optionally, with intervention of a primer layer is formed by coating with a photosensitive composition comprising an elastomeric binder resin, a polymerizable monomer compound and a non-infrared-sensitive polymerization initiator. It is essential that the photosensitive resinous layer formed from the photosensitive composition can be dissolved away from the substrate surface in the unpolymerized areas by a solvent in the development treatment.

The above mentioned elastomeric binder resin is exemplified by polydiolefins and random and block copolymers of an aromatic vinyl compound and a diolefin such as styrene/butadiene copolymers, styrene/isoprene copolymers, polybutadienes and polyisoprenes, diolefin/acrylonitrile copolymers, ethylene/propylene copolymers, ethylene/propylene/diolefin copolymers, ethylene/acrylic acid copolymers, diolefin/acrylic acid copolymers, diolefin/acrylic acid ester/acrylic acid copolymers, ethylene/(meth)acrylic acid/(meth)acrylic acid ester copolymers, polyamides, polyvinyl alcohols, graft copolymers of a polyvinyl alcohol and a polyethyleneglycol, amphoteric interpolymers, cellulose derivatives such as alkyl celluloses, hydroxyalkyl celluloses and nitrocelluloses, ethylene/vinyl acetate copolymers, cellulose acetate butyrates, polybutyrals, cyclized rubbers, styrene/acrylic acid copolymers, polyvinyl pyrrolidones and vinyl pyrrolidone/vinyl acetate copolymers. These elastomeric resins can be used either singly or as a blend of two kinds or more, if compatible.

Besides, suitable binder resins soluble or dispersible in an aqueous developer solution are disclosed in U.S. Pat. Nos. 3,458,311, 4,442,302, 4,361,640, 3,794,494, 4,177,074, 4,431,723 and 4,517,279. Elastomeric binder resins soluble, swellable or dispersible in an organic developer solvent or solution are disclosed in U.S. Pat. Nos. 4,323,636, 4,430,417, 4,045,231, 4,460,675 and 4,894,315.

It is important that the polymerizable monomeric compound contained in the photosensitive resinous layer (B) or a polymer thereof has good miscibility with the above described elastomeric binder resin in order to form a clear photosensitive resinous layer without cloudiness. A variety of monomeric compounds satisfying such a requirement are known in the prior art as an ingredient used in the preparation of flexographic printing plates including those disclosed in U.S. Pat. Nos. 4,323,636, 4,753,865, 4,726,877 and 4,894,315.

Examples of suitable monomeric compounds usable in the present invention are exemplified by acrylic esters such as ethyleneglycol diacrylate, triethyleneglycol diacrylate, 1,3-butanediol diacrylate, tetramethyleneglycol diacrylate, propyleneglycol diacrylate, neopenteneglycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethyleneglycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomer as well as methacrylic esters corresponding to the above named acrylic esters, itaconic esters such as ethyleneglycol diitaconate, propyleneglycol diitaconate, 1,3-butanediol diitaconate, 1,4-butanediol diitaconate, tetramethyleneglycol diitaconate, pentaerythritol diitaconate and sorbitol tetraitaconate, crotonic esters such as ethyleneglycol dicrotonate, tetramethyleneglycol dicrotonate, pentaerythritol dicrotonate, sorbitol tetracrotonate, ethyleneglycol diisocrotonate, pentaerythritol diisocrotonate and sorbitol tetraisocrotonate, maleic esters such as ethyleneglycol dimaleate, triethyleneglycol dimaleate, pentaerythritol dimaleate and sorbitol tetramaleate and unsaturated carboxylic amides such as methylenebis(meth)acrylamide, 1,6-hexamethylenebis(meth)acrylamide, diethylenetriamine trisacrylamide and xylylenebis(meth)acrylamide.

The amount of the polymerizable monomeric compound in the photosensitive resinous composition for the layer (B) is in the range from 5% to 500% by weight or, preferably, from 10% to 100% by weight based on the elastomeric binder resin. When the proportion of the monomeric compound is too high, the photosensitive resinous layer is poor in the film-forming behavior while, when the proportion of the monomeric compound is too low, the adhesive bonding strength of the photosensitive resinous layer to the barrier layer (C) formed thereon is decreased or a trouble is caused due to air occlusion or exfoliation of the photosensitive resinous layer starting from periphery.

The polymerization initiator contained in the photosensitive resinous layer (B) must have photosensitivity to actinic rays having wavelengths outside of the infrared range and should have no photosensitivity to the infrared light. Examples of suitable polymerization initiators include aromatic ketones such as benzophenone and benzoin ethers such as benzoin methyl ether, benzoin ethyl ether, benzoin isopropyl ether, α-methylolbenzoin methyl ether, α-methoxybenzoin methyl ether and 2,2-diethoxyphenyl acetophenone. These polymerization initiator compounds can be used either singly or as a combination of two kinds or more. In addition, substituted or unsubstituted polynuclear quinone compounds, such as those disclosed in U.S. Pat. Nos. 4,460,675 and 4,894,315, can be used as the polymerization initiator.

The amount of the polymerization initiator in the photosensitive resinous layer (B) is in the range from 0.5 to 50% by weight or, preferably, from 3 to 35% by weight based on the overall amount of the layer.

It is optional according to need that the coating composition for the formation of the photosensitive resinous layer (B) in the present invention contains a variety of known additives conventionally added to photosensitive compositions including organic solvents such as ethyleneglycol monomethyl ether, ethyleneglycol monoethyl ether, propyleneglycol monomethyl ether, propyleneglycol monoethyl ether, diethyleneglycol monomethyl ether, diethyleneglycol monoethyl ether, diethyleneglycol dimethyl ether, diethyleneglycol diethyl ether, propyleneglycol monomethyl ether acetate, propyleneglycol monoethyl ether acetate, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate and 2-methoxypentyl acetate, thermal polymerization inhibitors such as hydroquinone and hydroquinone monoethyl ether, silicone-based and fluorine-containing antifoam agents, anionic, cationic and non-ionic surface active agents, matting agents such as silica fillers, photosensitizers, plasticizers and coloring agents.

The method for forming the photosensitive resinous layer (B) on the surface of a substrate (A) is not particularly limitative according to a known procedure conventionally undertaken in the preparation of flexographic printing plates. For example, the essential and optional ingredients of the photosensitive resinous layer (B) are dissolved in a suitable organic solvent such as chloroform, tetrachloroethylene, methyl ethyl ketone and toluene to form a solution which is poured into the space surrounded by a framework on the substrate surface followed by evaporation of the solvent to form a dried resinous layer on the surface. Alternatively, the component ingredients are blended without using any organic solvent in a kneader or on a roll mill and the thus compounded resinous composition is shaped into the form of a sheet having a specified thickness by using a suitable molding machine such as extruders, injection molding machines and molding presses and the thus shaped sheet is laminated with the substrate. The photosensitive resinous layer formed by these methods have a thickness in the range from 0.1 to 3.0 mm or, preferably, from 0.5 to 2.0 mm.

The barrier layer (C) formed on the above-described photosensitive resinous layer (B) has a low permeability to oxygen and protects the photosensitive resinous layer (B) against the influence of the atmospheric oxygen. The barrier layer (C) is required to have good transmissivity to non-infrared light for patterning exposure of the photosensitive layer and to be capable of being removed by dissolving, swelling, dispersing or lifting in the developer solvent or solution used for the development treatment of the photosensitive resinous layer after patternwise exposure to light.

The barrier layer (C) also serves to protect the photosensitive resinous layer (B) in the process of removing the masking layer (D) by irradiation with infrared laser beams and to inhibit migration of the component ingredients between the photosensitive resinous layer (B) and the masking layer (D).

It is essential that the barrier layer (C) contains a resinous compound selected from polyvinyl pyrrolidones and alkali-soluble cellulose derivatives in order to be able to control permeation of atmospheric oxygen.

It is essential that the material of the barrier layer (C) has an oxygen permeability coefficient in the range from $4 \times 10^{-19}$ to $4 \times 10^{-13}$ liter·m/m$^2$·s·Pa or, preferably, from $1 \times 10^{-18}$ to $9 \times 10^{-14}$ liter·m/m$^2$·s·Pa. This value of the oxygen permeability coefficient can be accomplished by using a polyvinyl pyrrolidone or an alkali-soluble cellulose derivative as the material of the barrier layer (C).

When the oxygen permeability coefficient of the barrier layer (C) is too small, the patterned photosensitive resinous layer has a rounded profile of the cross section at the skirt portions not to give a sufficient relief depth. When the oxygen permeability coefficient is too large, on the other hand, the patterned relief of the photosensitive resinous layer (B) has a cross sectional profile rounded at the shoulders due to the inhibitive effect of the atmospheric oxygen on the polymerization reaction in the photosensitive resinous layer (B) so that the dot gain is increased resulting in a decrease in the printing quality.

When the patterning light-exposure of the photosensitive resinous layer is conducted in the atmospheric air, the polymerization reaction in the surface layer of the printing plate proceeds under a strong inhibitive effect of the oxygen so that the relief of the resinous layer has a cross sectional profile rounded at the shoulders so that the dot gain in printing is increased. When the photosensitive resinous layer covered by the barrier layer of an appropriate oxygen permeability coefficient is patternwise exposed to light, on the other hand, the patterned relief of the resinous layer (B) obtained by development has a cross sectional profile having approximately orthogonally angled shoulders to minimize the dot gain in printing. Particularly preferable materials for the barrier layer (C) in this regard include polyvinyl pyrrolidones and alkali-soluble cellulose derivatives having an oxygen permeability coefficient of about $6.7 \times 10^{-16}$ liter·m/m$^2$·s·Pa.

By using such a barrier layer (C), the patterned relief obtained by development has a cross sectional profile with approximately orthogonal shoulders so that the dot gain in printing can be minimized to give excellent quality of printing along with improved printing durability of the printing plate owing to an increased angle in the lower part of the cross sectional profile of the relief as compared with the printing plates prepared by utilizing a digital plate-making system or conventional printing plate-making system. As a result of using such a barrier layer, the present invention provides a multilayered photosensitive material for the preparation of a flexographic printing plate having a cross sectional profile of the relief of higher adaptability to printing.

The above mentioned alkali-soluble cellulose derivatives are particularly preferable as the component of the barrier layer (C) in respect of the adhesive bonding to the photosensitive resinous layer (B) and the masking layer (D) so that, even in the case where a covering sheet is provided on the masking layer (D), lifting of the other layers can be prevented in the removal of the covering sheet.

It is further optional according to need that the barrier layer (C) contains a plasticizer or surface active agent with an object to improve the properties of the barrier layer (C) as a coating film. Namely, plasticizers contained in the barrier layer (C) have an effect of decreasing the troubles due to occurrence of creases when the multilayered plate-making material is bent or folded while creases lead to flaws in the flexographic printing plate resulting in a decrease of the printing quality. This crease-preventing effect of a plasticizer is particularly remarkable when the resinous ingredient in the barrier layer (C) is an alkali-soluble cellulose derivative.

Examples of the plasticizers, which can be contained in the barrier layer (C), include triphenyl phosphite, dimethyl phthalate, diethyl phthalate, dicyclohexyl phthalate, ethyleneglycol dibenzoate, glyceryl carbonate, polyethyleneglycol, tributyl citrate and urethane oligomers.

Fluorine-containing surface active agents are particularly preferable as the surface active agent contained in the barrier layer (C).

The barrier layer (C) should have a sufficiently large thickness in order to effectively control permeation of the atmospheric oxygen while the thickness of the layer (C) should be sufficiently small in order to minimize the shielding effect against the exposure light for the patterning exposure of the photosensitive resinous layer (B). In consideration of the balance between these contradictory requirements and assuming that the material of the barrier layer has an oxygen permeability coefficient in the above specified range, the barrier layer (C) has a thickness in the range from 0.05 to 20 $\mu$m or, preferably, from 0.1 to 10 $\mu$m.

The solvent used in the formation of the barrier layer (C) is not particularly limitative and any organic solvents can be used therefor provided that the photosensitive resinous layer (B) and the masking layer (D) in contact with the barrier layer (C) are not dissolved or swollen by the solvent. Examples of suitable solvents include ethers such as dioxane, diethyl ether, dibutyl ether, diisopropyl ether and tetrahydrofuran, ketones such as acetone, diethyl ketone, methyl ethyl ketone, methyl isobutyl ketone, methyl propyl ketone and cyclohexanone, esters such as ethyl acetate, n-propyl acetate and n-butyl acetate, aromatic hydrocarbon solvents such as benzene, toluene and xylene and amides such as dimethylformamide. These organic solvents can be used either singly or as a mixture of two kinds or more. In addition, mixtures of water and an alcohol can be used for the purpose. Examples of suitable alcohols include methyl, ethyl, n-propyl, isopropyl, cyclohexyl and 3-methyl-3-methoxybutyl alcohols.

The barrier layer (C) can be formed on the photosensitive resinous layer (B) or on the masking layer (D) by laminating or by coating using a known coating machine such as a wheeler, roll coater, reverse coater, electrostatic coater, spin coater, bar coater and the like.

The topmost layer formed on the above described barrier layer (C) is a masking layer (D) which contains a film-forming binder resin, infrared-absorbing compound and a shielding agent against light other than infrared light and is capable of being removed by irradiation with an infrared laser beam.

The above mentioned film-forming binder resin is required to be soluble in an organic solvent to give a solution which gives a dried coating film when a coating layer thereof on a surface is dried by evaporation of the solvent. The resin is also required that the coating film containing the resin is removable when irradiated with infrared laser beams by melting with the heat generated in the infrared-absorbing compound in the film.

Examples of such a film-forming binder resin include vinyl polymers, unvulcanized rubbers, polyoxyalkylenes, cellulosic polymers, polyesters, polyurethanes, polyamides, polyimides and polycarbonates though not particularly limitative thereto. These binder resins can be used either singly or as a combination of two kinds or more, if compatible. Particularly preferable film-forming binder resins include polyamides, polyvinyl alcohols, cellulosic polymers such as, more preferably, alkyl celluloses, hydroxypropyl celluloses, hydroxyethyl celluloses and nitrocelluloses, copolymers of ethylene and vinyl acetate, cellulose acetate butyrates, polybutyrals and cyclized rubbers as well as mixtures thereof.

The masking layer (D) is required to contain an infrared-absorbing agent which plays a role that, when irradiated with infrared laser beams, the agent absorbs the energy of the infrared light to generate heat thereby to melt and remove the film-forming binder resin. The infrared absorbing agent is not particularly limitative provided that the energy of infrared laser beams can efficiently be absorbed thereby to be converted into thermal energy.

Examples of the infrared absorbing agents suitable for the masking layer include black pigments such as carbon black, aniline black and cyanine black, phthalocyanine, naphthalocyanine-based green pigments, graphite, iron powders, diamine-based metal complexes, dithiol-based metal complexes, phenolthiol-based metal complexes, mercaptophenol-based metal complexes, crystalline inorganic compounds containing water of crystallization, copper sulfate, chromium sulfide, silicate compounds, metal oxides such as chromium oxide, titanium dioxide, vanadium oxide, manganese oxide, iron oxide, cobalt oxide and tungsten oxide as well as hydroxides and sulfates of the metallic elements, and powders of a metal such as bismuth, iron, magnesium and aluminum.

Among the above named infrared absorbing agents, carbon black is particularly preferable in respects of high efficiency of energy conversion from light to heat, economical advantages and easiness of handling. While carbon blacks can be used irrespective of the particle diameter in the range from 10 to 100 nm, the particle diameter should desirably be as small as possible since carbon black particles having a smaller particle diameter have higher sensitivity to infrared light.

Besides the above named infrared absorbing agents, dyes having absorptivity to infrared or near-infrared light can also be used as the infrared absorbing agent provided that the dye has a maximum absorption in the wavelength range from 700 to 20000 nm.

Though not particularly limitative, the infrared-absorbing dye should preferably be an acidic dye, basic dye or oil-soluble dye including cyanine dyes, phthalocyanine dyes, phthalocyanine-metal complex dyes, naphthalocyanine dyes, naphthalocyanine-metal complex dyes, dithiol-metal complex dyes, naphthoquinone dyes, anthraquinone dyes, indophenol dyes, indoaniline dyes, pyrylium dyes, thiopyrylium dyes, squalilium dyes, croconium dyes, diphenylmethane dyes, triphenylmethane dyes, triphenylmethane phthalide dyes, triarylmethane dyes, phenothiazine dyes, phenoxazine dyes, fluoran dyes, thiofluoran dyes, xanthene dyes, indolylphthalide dyes, spiropyran dyes, azaphthalide dyes, chromenopyrazole dyes, leucoauramine dyes, Rhodamine lactam dyes, quinazoline dyes, diazaxanthene dyes, bislactone dyes, fluorine dyes, monoazo dyes, ketone imine dyes, diazo dyes, polymethine dyes, oxazine dyes, nigrosine dyes, bisazo dyes, bisazostilbene dyes, bisazooxadiazole dyes, bisazofluorenone dyes, azochromium complex dyes, trisazotriphenylamine dyes, thioindigo dyes, perylene dyes, nitroso dyes, 1:2-metal complex dyes, intermolecular CT dyes, quinoline dyes and quinophthalone dyes as well as triphenylmethane-based leuco dyes, cationic dyes, azo-based disperse dyes, benzothiopyran-based spiropyran dyes, 3,9-dibromoanthoanthrone dyes, indanthrone dyes, phenolphthalein dyes, sulfophthalein dyes, Ethyl Violet, Methyl Orange, fluorescein, methyl viologen, Methylene Blue or Dimroth betaine.

Among the above named infrared-absorbing dyes, those having a maximum absorption of light in the wavelength range from 750 to 2000 nm are preferable including cyanine dyes, azulenium dyes, squalilium dyes, croconium dyes, azo-based disperse dyes, bisazostilbene dyes, naphthoquinone dyes, anthraquinone dyes, perylene dyes, phthalocyanine dyes, naphthalocyanine-metal complex dyes, polymethine dyes, dithiol-nickel complex dyes, indoaniline-metal complex dyes, intermolecular CT dyes, benzothiopyran-based spiropyran dyes and nigrosine dyes.

Although these infrared-absorbing agents can be used, even as used singly, to exhibit the desired effect of increasing the sensitivity, it is sometimes possible to further increase the effect of sensitivity improvement. When two kinds or more of the infrared-absorbing compounds having different wavelengths of maximum absorption are used in combination, the masking layer can be imparted with adaptability to two or more lasers having different oscillation wavelengths.

The amount of the infrared-absorbing agent in the masking layer is in the range from 0.001 to 10 parts by weight or, preferably, from 0.05 to 5 parts by weight per 100 parts by weight of the binder resin. When the amount of the infrared-absorbing compound is too small, the desired effect of sensitivity improvement to the laser beams cannot be obtained while, when the amount is too large, the flexibility of the coating film is decreased.

The non-infrared shielding compound is not particularly limitative provided that the compound can reflect or absorb visible light and ultraviolet light and can be selected from ultraviolet-absorbing compounds, visible light-absorbing compounds, dark-colored inorganic pigments and combinations thereof, of which carbon black and graphite are preferred because these materials act in binary ways as the non-infrared shielding agent and as the infrared-absorbing agent. The advantages of these materials are also due to the inexpensiveness thereof and easiness of handling as compared with powders of certain metals and alloys.

These non-infrared shielding compounds are contained in the masking layer, preferably, in such an amount that the masking layer has an optical density of at least 2.0. Such an optical density of the masking layer can be obtained when the amount of the non-infrared shielding agent is in the range from 5 to 40 parts by weight or, preferably, from 15 to 25 parts by weight per 100 parts by weight of the film-forming binder resin in order to exhibit full shielding effect against non-infrared lights. When the amount thereof is too small, the desired shielding effect against non-infrared lights cannot be obtained as a matter of course while, when the amount is too large, a decrease is caused in the flexibility of the masking layer as a coating film. When a single compound, which acts in two ways as an infrared-absorbing agent and as a non-infrared shielding agent, is employed, the amount thereof is in the range from 10 to 30 parts by weight per 100 parts by weight of the film-forming binder resin.

It is optional according to need that the masking layer in the present invention contains a variety of known additives such as a levelling agent, surface active agent, dispersing agent, plasticizer, adhesion improver, coating aid and the like.

Plasticizers added to the masking layer have an effect to decrease the troubles due to occurrence of creases when the multilayered photosensitive material of the invention is folded or bent. Examples of suitable plasticizers include triphenyl phosphite, dimethyl phthalate, diethyl phthalate, dicyclohexyl phthalate, ethyleneglycol benzoate, glyceryl carbonate, polyethyleneglycol, tributyl citrate and urethane oligomers. The surface active agent as the additive is preferably a fluorine-containing surface active agent.

The thickness of the masking layer (D) should be small enough in order to be rapidly removed when exposed to infrared laser beams. On the other hand, it is a requirement for the masking layer to exhibit an effect of fully shielding non-infrared lights. In consideration of the balance of these requirements, the masking layer has a thickness in the range from 0.05 to 20 $\mu$m or, preferably, from 0.1 to 10 $\mu$m.

In a preferable embodiment of the inventive multilayered photosensitive material, an alkali-soluble cellulose derivative is used as the resinous ingredient in the barrier layer (C) and a non-miscible alkali-soluble cellulose derivative is used as the film-forming binder resin in the masking layer (D).

The masking layer (D) of the inventive multilayered photosensitive material can be formed by coating the surface of the barrier layer (C) with a coating solution containing a film-forming binder resin, infrared-absorbing agent and non-infrared shielding compound according to a conventional coating method followed by drying. The coating solution is prepared by first dissolving a film-forming binder resin in a suitable organic solvent to give a solution in which an infrared-absorbing agent and a non-infrared shielding agent are dispersed. Separately, the barrier layer (C) is formed by coating in the above-described method on a cover sheet (E), which is an optional layer, and this cover sheet (E) is bonded to the photosensitive layer (B) by the method of laminating or by press-bonding. This method is particularly effective when carbon black or graphite powder is used to serve as the infrared-absorbing agent and non-infrared shielding agent.

Like conventional multilayered photosensitive materials for the preparation of a flexographic printing plate, the multilayered photosensitive material of the present invention can be provided, if so desired, with a cover sheet (E) on the masking layer (D) with an object to protect the multilayered photosensitive material of the invention. Suitable cover sheets include films of a polymeric resin, woven and non-woven fabrics and foils of a metal such as steel, aluminum and the like, of which films of polyethylene, polyester or polypropylene and laminates of these films are preferred. The cover sheet has a thickness in the range from 20 to 200 $\mu$m. Since the object of the cover sheet is for protection of the inventive multilayered photosensitive material, the cover sheet is removed by peeling prior to the plate making procedure by patterning with infrared laser beams. It is further optional according to need that a releasing layer intervenes between the cover sheet (E) and the masking layer (D).

The multilayered photosensitive material of the present invention is prepared by first forming a photosensitive resinous layer (B) on a substrate (A) and then forming a barrier layer (C) and a masking layer (D) successively thereon by the method of coating or lamination. Formation of the masking layer can be performed by coating according to a known coating method including spray coating, vacuum vapor deposition and sputtering a solution including a film forming binder resin, an infrared absorbing agent and a non-infrared light shielding compound on the cover sheet (E) or the barrier layer (C).

Like the masking layer (D), the barrier layer (C) can be formed by any known method including spray coating, vacuum vapor deposition and sputtering. The barrier layer (C) can be formed on the cover sheet (E) for temporary protection, on the photosensitive layer (B) or on the masking layer (D) and the respective layers are laid one on the other and press-bonded together under an appropriate pressure. Alternatively, all of the layers can be formed successively on the substrate (A) or on the cover sheet (E).

A typical procedure for processing the inventive multilayered photosensitive material into a flexographic printing plate is as follows comprising the steps of: (1) forming a patterned mask by patternwise removing the masking layer (D) with an infrared laser beam, (2) forming a latent image of the pattern in the photosensitive resinous layer (B) by whole-surface light-exposure with a light other than infrared light through the patterned masking layer as the exposure mask and (3) developing the latent image in the photosensitive layer (B) using a developer solvent or solution to form a patterned relief of the photosensitive resinous layer (B) for the printing plate.

The wavelength of the infrared laser beam, to which the masking layer (D) is patternwise exposed, can be in the range from 750 to 2000 nm. Various types of lasers emitting laser beams of a wavelength in this range can be used including argon ion lasers, krypton ion lasers, helium-neon lasers, helium-cadmium lasers, ruby lasers, glass lasers, titanium lasers, sapphire lasers, dye lasers, nitrogen lasers, metal-vapor lasers, semiconductor lasers and YAG lasers. In particular, semiconductor lasers of 750 to 880 nm wavelengths and Nd-YAG lasers of 1060 nm wavelength are preferable for the purpose. The laser beam-generating unit of these infrared lasers is computer-controlled together with the driving unit for patternwise exposure of the masking layer (D) on the photosensitive resinous layer (B) so that a flexographic printing plate can be prepared by incorporating the digital patterning information signals into the inventive multilayered photosensitive material.

The non-infrared light, to which the above mentioned photosensitive resinous layer (B) is patternwise exposed, means the light having a wavelength shorter than that of infrared light or, preferably, in the wavelength range from 150 to 600 nm or, more preferably, from 300 to 400 nm. Examples of the light source to emit the non-infrared light include high-pressure mercury lamps, ultraviolet fluorescent lamps, carbon arc lamps and xenon lamps. It is optional to undertake whole-surface light-exposure of the photosensitive material from the backside of the substrate in order to improve the stability of the patterned relief after exposure against the development treatment to dissolve away the resinous layer in the uncured areas.

In the development treatment of the patternwise light-exposed photosensitive resinous layer (B), various kinds of developer liquids which can dissolve the uncured photosensitive resinous layer (B), are used for the purpose including organic solvents and water as well as water-base and semi-water-base solutions. Selection of the developer liquids depends on the chemical nature of the resinous layer to be dissolved away. Organic solvents suitable as the developer include aromatic and aliphatic hydrocarbons and aromatic and aliphatic halogenated hydrocarbons as well as mixtures thereof with an alcohol. A suitable semi-water-base developer is a mixture of water and a water-miscible organic solvent containing an alkaline compound dissolved therein. A suitable water-base developer is an aqueous solution of an alkaline compound. Particular examples of the developer liquids include esters such as heptyl acetate and 3-methoxybutyl acetate, hydrocarbons such as petroleum fractions, toluene and decahydronaphthalene, chlorinated hydrocarbons such as tetrachloroethylene, amines such as monoethanolamine, diethanolamine and triethanolamine and aqueous alkaline solutions containing sodium hydroxide, potassium hydroxide, sodium carbonate or ammonia. These developer liquids can optionally be admixed with an alcohol such as propyl alcohol, butyl alcohol and pentyl alcohol. The development treatment to dissolve away the resinous layer with the developer liquid can be performed in various ways including dipping in the developer liquid, ejection of the liquid out of a nozzle and brushing with a brush wet with the liquid.

If not particularly indicated otherwise, the term of "a multilayered photosensitive material for the preparation of a flexographic printing plate" or "a flexographic printing plate" includes a plate or structural body of any configuration suitable for flexographic printing, which may be in the form of a flat sheet or of a seamless continuum, though not particularly limitative thereto.

According to the present invention, permeation of the atmospheric oxygen can be controlled so as to improve the cross sectional profile of the flexographic printing plate prepared by the development treatment. Accordingly, the printing plate relief can be imparted with sharply edged shoulder lines so as to greatly improve the printing quality and printing durability of the printing plate.

In the following, the multilayered photosensitive material of the present invention is described in more detail by way of Examples as preceded by Reference Examples describing preparation of respective coating solutions.

REFERENCE EXAMPLE 1

A 5% by weight solution of a hydroxypropyl methyl cellulose acetate phthalate was prepared by dissolving 2.5 g of the cellulose derivative in 47.5 g of cyclohexanone and the solution was uniformly admixed with 1.5 g of a plasticizer (M-1310, a product by Toa Gosei Co.) under agitation. This solution was admixed with 1.25 g of a dispersion containing 40% by weight of carbon black (MHI Black #217, a product by Mikuni Shikiso Co.) and agitated to give a uniform carbon black-containing coating solution of the resin for masking layer formation, referred to as the solution D1 hereinafter.

REFERENCE EXAMPLE 2

A 5% by weight solution of a nylon resin was prepared by dissolving 2.5 g of the resin (Macromelt 6900, a product by Henkel Hakusui Co.) in 47.5 g of cyclohexanone and the solution was uniformly admixed with 1.25 g of the same carbon black dispersion as used in Reference Example 1 and agitated to give a uniform carbon black-containing coating solution of the resin for masking layer formation, referred to as the solution D2 hereinafter.

REFERENCE EXAMPLE 3

A 5% by weight solution of a polyester resin (Bilon 200, a product by Toyobo Co.) was prepared by dissolving 2.5 g of the resin in 47.5 g of cyclohexanone and this solution was uniformly admixed with 1.25 g of the same carbon black dispersion as used in Reference Example 1 under agitation to give a uniform carbon black-containing coating solution of the resin for masking layer formation, referred to as the solution D3 hereinafter.

REFERENCE EXAMPLE 4

A uniform solution of 5% by weight concentration was prepared by dissolving 2.5 g of a hydroxypropyl methyl cellulose acetate succinate (AS-L, a product by Shin-Etsu Chemical Co.) in 47.5 g of a 50:50 by volume mixture of isopropyl alcohol and 3-methyl-3-methoxybutyl alcohol. A 50 g portion of this solution was further admixed with 1.5 g of the same plasticizer as used in Reference Example 1 under agitation to give a coating solution for barrier layer formation, referred to as the solution C1 hereinafter.

REFERENCE EXAMPLE 5

A coating solution for barrier layer formation, referred to as the solution C2 hereinafter, was prepared in substantially the same manner as in Reference Example 4 excepting for the replacement of the plasticizer M-1310 with the same amount of another plasticizer (U-340A, a product by Shin-Nakamura Kagaku Co.).

REFERENCE EXAMPLE 6

A coating solution for barrier layer formation, referred to as the solution C3 hereinafter, was prepared by dissolving a polyvinyl pyrrolidone resin (Lubiskol K-90, a product by BASF Co.) in a 8:2 by volume mixture of water and isopropyl alcohol in a concentration of 5% by weight.

REFERENCE EXAMPLE 7

A coating solution for barrier layer formation, referred to as the solution C4 hereinafter, was prepared by dissolving a polyvinyl alcohol resin (PVA 405, a product by Kuraray Co.) in a 8:2 by volume mixture of water and isopropyl alcohol in a concentration of 5% by weight.

REFERENCE EXAMPLE 8

A coating solution for barrier layer formation, referred to as the solution C5 hereinafter, was prepared by dissolving a polyester resin (Bilon 200, a product by Toyobo Co.) in ethyl acetate in a concentration of 5% by weight.

REFERENCE EXAMPLE 9

A sheeting composition for photosensitive layer formation was prepared by mixing 100 parts by weight of a styrene/butadiene copolymer having a weight-average molecular weight of 240000 (D-1155, a product by JSR Shell Elastomer Co.), 70 parts by weight of a liquid poly (1,2-butadiene) having a weight-average molecular weight of 1000 (Nisso PB-1000, a product by Nisso Co.), 10 parts by weight of trimethylolpropane triacrylate, 3 parts by weight of methoxyphenyl acetone, 0.05 part by weight of 2,6-di-tert-butyl-4-hydroxy toluene, 0.002 part by weight of a dye (Oil Blue #503, a product by Orient Chemical Co.) and 0.2 part by weight of tetrahydrofuran.

EXAMPLES 1 TO 9 AND COMPARATIVE EXAMPLES 1 AND 2

A polyethylene terephthalate sheet having a thickness of 100 μm to serve as a cover sheet was coated with one of the solutions for masking layer formation D1, D2 and D3 prepared in Reference Examples 1 to 3 and heated at 70° C. for 5 minutes to form a dried coating film of 2.5 μm thickness as a masking layer. Thereafter, the masking layer was patternwise exposed to infrared laser beams to effect sublimation of the layer to form a patterned mask layer transmitting and shielding non-infrared lights in the areas exposed and unexposed, respectively, to the infrared laser beams. The optical density of this masking layer to the light of 370 nm wavelength was 2.5 as measured on a spectrophotometer (Model U-2000, manufactured by Hitachi Ltd.).

The above obtained patterned mask layer on the cover sheet was overcoated with one of the solutions C1 to C5 for barrier layer formation prepared in Reference Examples 4 to 8 followed by heating at 100° C. for 5 minutes to form a dried barrier layer having a thickness of 2.5 μm.

Separately, the sheeting composition for photosensitive layer formation prepared in Reference Example 9 was sheeted in a thickness of 1.7 mm onto a polyethylene terephthalate sheet to serve as a substrate by extrusion molding through a T-die of an extruder machine by using a high-viscosity pump.

The barrier layer in the three-layered sheet consisting of the cover sheet, patterned mask layer and barrier layer was brought into contact with the photosensitive layer on the substrate sheet and laminated together by press-bonding through a press-bonding roller.

The photosensitive layer was subjected to back exposure to light in an energy density of 75 mJ/cm$^2$ through the substrate film followed by removal of the cover sheet to obtain a multilayered photosensitive material for flexographic printing plate preparation. The multilayered material was wound around and fixed to the outer surface of a drum of 850 mm circumferential length in a laser writing instrument and, while being rotted at 150 rpm, was irradiated with a laser beam from a semiconductor laser of 100 mW energy output to effect patternwise sublimation of the mask layer in a resolution of 100 lines per mm.

The multilayered photosensitive material after completion of the sublimation treatment of the mask layer was mounted on an exposure machine (Polimero Exposure Unit XL) and subjected to main light-exposure from the photosensitive layer side with ultraviolet light having a central wavelength at 370 nm by using an ultraviolet fluorescent lamp 10R in an energy density of 2500 mJ/cm$^2$.

The photosensitive material after the ultraviolet exposure was subjected to a development treatment in a development unit (Model PRO-1006, manufactured by Tokyo Ohka Kogyo Co.) by using a petroleum hydrocarbon-based developer solution (FDO-S, a product by Tokyo Ohka Kogyo Co.) at 25° C. taking 4 minutes to find good developability of the resinous layer in the developer solution absolutely without re-deposition of the scums or other debris onto the printing relief surface of the printing plate.

After the above described development treatment, the plate was dried by heating at 55° C. for 40 minutes and was subjected to a post-exposure treatment on the same exposure machine as used above by using an ultraviolet fluorescent lamp emitting ultraviolet light having a central wavelength at 250 nm to complete a flexographic printing plate.

The flexographic printing plates thus prepared in the Examples and Comparative Examples were each subjected to evaluation tests for the cross sectional profile of the relief-patterned photosensitive resinous layer and the durability in printing. The results of these evaluation tests are shown in Table 1 below, which also shows the barrier layer-forming coating solution, i.e. C1 to C5, and the masking layer-forming coating solution, i.e. D1 to D3, used in the preparation of the multilayered photosensitive materials. The results of the evaluation tests are rated in four ranks of 1, 2, 3 and 4 according to the following criteria for each of the testing items.

(1) Cross sectional profile of the relief layer
   1: sharply edged shoulder lines
   2: slightly rounded shoulder lines
   3: rounded shoulder lines
   4: heavily rounded shoulder lines (2) Printing durability:
   1: more than 10000 times printing runs
   2: 5000 to 10000 times printing runs
   3: 1000 to 5000 times printing runs
   4: less than 1000 times printing runs

TABLE 1

| | Constitution of multilayered photosensitive material | | Results of evaluation | |
|---|---|---|---|---|
| | Coating solution for barrier layer | Coating solution for masking layer | Cross sectional profile of relief layer | Printing durability |
| Example | | | | |
| 1 | C1 | D1 | 1 | 1 |
| 2 | C1 | D2 | 1 | 1 |
| 3 | C1 | D3 | 1 | 1 |
| 4 | C2 | D1 | 1 | 1 |
| 5 | C2 | D2 | 1 | 1 |
| 6 | C2 | D3 | 1 | 1 |
| 7 | C3 | D1 | 2 | 2 |
| 8 | C3 | D2 | 2 | 2 |
| 9 | C3 | D3 | 2 | 2 |

TABLE 1-continued

| | Constitution of multilayered photosensitive material | | Results of evaluation | |
|---|---|---|---|---|
| | Coating solution for barrier layer | Coating solution for masking layer | Cross sectional profile of relief layer | Printing durability |
| Comparative Example | | | | |
| 1 | C4 | D1 | 4 | 4 |
| 2 | C5 | D1 | 3 | 3 |

What is claimed is:

1. A multilayered photosensitive material for the preparation of a flexographic printing plate which comprises, as an integral layered body:
 (A) a substrate layer;
 (B) a layer of a photosensitive resinous composition having sensitivity to light excepting infrared light comprising (b1) an elastomeric binder resin, (b2) a polymerizable monomeric compound and (b3) a polymerization initiator, formed on the surface of the substrate layer (A);
 (C) a barrier layer of a composition comprising a resin which is an alkali-soluble cellulose compound, which transmits light other than infrared light and is removable in a development treatment, formed on the surface of the photosensitive resinous layer (B), said composition further comprising a plasticizer; and
 (D) a masking layer of a composition comprising (d1) a film-forming binder resin, (d2) an infrared absorbing compound and (d3) a compound having no transmissivity to light other than infrared light and capable of being removed by irradiation with an infrared laser beam, formed on the surface of the barrier layer (C).

2. The multilayered photosensitive material for the preparation of a flexographic printing plate as claimed in claim 1 in which the substrate is a film of a polyethylene terephthalate resin having a thickness in the range from 50 to 300 $\mu$m.

3. The multilayered photosensitive material for the preparation of a flexographic printing plate as claimed in claim 1 in which the elastomeric binder resin (b1) in the composition forming the photosensitive resinous layer (B) is selected from the group consisting of polydiolefins, random and block copolymers of an aromatic vinyl compound and a diolefin, diolefin/acrylonitrile copolymers, ethylene/propylene copolymers, ethylene/propylene/diolefin copolymers, ethylene/acrylic acid copolymers, diolefin/acrylic acid copolymers, diolefin/acrylic acid ester/acrylic acid copolymers, ethylene/(meth)acrylic acid/(meth)acrylic acid ester copolymers, polyaxnides, polyvinyl alcohols, graft copolymers of a polyvinyl alcohol and a polyethyleneglycol, amphoteric interpolymers, ethylene/vinyl acetate copolymers, cellulose acetate butyrates, polybutyrals, cyclized rubbers, styrene/acrylic acid copolymers, polyvinyl pyrrolidones and vinyl pyrrolidone/vinyl acetate copolymers.

4. The multilayered photosensitive material for the preparation of a flexographic printing plate as claimed in claim 1 in which the photosensitive resinous layer (B) has a thickness in the range from 0.1 to 3.0 mm.

5. The multilayered photosensitive material for the preparation of a flexographic printing plate as claimed in claim 1 in which the barrier layer (C) has a permeability coefficient to oxygen in the range from $4\times10^{-19}$ to $4\times10^{-13}$ liter·m/m$^2$·s·Pa.

6. The multilayered photosensitive material for the preparation of a flexographic printing plate as claimed in claim 1 in which the plasticizer is selected from the group consisting of triphenyl phosphite, dimethyl phthalate, diethyl phthalate, dicyclohexyl phthalate, ethylenpglycol dibenzoate, glyceryl carbonate, polyethyleneglycol, tributyl citrate and urethane oligomers.

7. The multilayered photosensitive material for the preparation of a flexographic printing plate as claimed in claim 1 in which the barrier layer (C) has a thickness in the range from 0.05 to 20 $\mu$m.

8. The multilayered photosensitive material for the preparation of a flexographic printing plate as claimed in claim 1 in which the film-forming binder resin (d1) is selected from the group consisting of vinyl polymers, uncrosslinked rubbers, polyethers, cellulose compounds, polyester compounds, polyurethanes, polyamides, polyimides and polycarbonates.

9. The multilayered photosensitive material for the preparation of a flexographic printing plate as claimed in claim 8 in which the film-forming binder resin (d1) is selected from the group consisting of polyamides, polyvinyl alcohols, copolymers of ethylene and vinyl acetate, cellulose acetate butyrates, polybutyrals and cyclized rubbers.

10. The multilayered photosensitive material for the preparation of a flexographic printing plate as claimed in claim 1 in which the infrared absorbing compound (d2) is selected from the group consisting of black pigments, phthalocyanine, naphthalocyanine green pigment, graphite, diamine metal complexes, dithiol metal complexes, phenolthiol metal complexes, mercaptophenol metal complexes, crystalline inorganic compounds containing water of crystallization, copper sulfate, chromium sulfide, silicate compounds, metal oxides, metal hydroxides and sulfates of the metallic elements and powders of a metal.

11. The multilayered photosensitive material for the preparation of a flexographic printing plate as claimed in claim 10 in which the infrared absorbing compound (d2) is carbon black.

12. The multilayered photosensitive material for the preparation of a flexographic printing plate as claimed in claim 10 in which the amount of the infrared absorbing compound (d2) is in the range from 0.001 to 10 parts by weight per 100 parts by weight of the film-forming binder resin (d1).

13. The multilayered photosensitive material for the preparation of a flexographic printing plate as claimed in claim 1 in which the non-infrared light shielding compound (d3) is carbon black or graphite.

14. The multilayered photosensitive material for the preparation of a flexographic printing plate as claimed in claim 1 in which the amount of the non-infrared shielding compound (d3) is in the range from 5 to 40 parts by weight per 100 parts by weight of the film-forming binder resin (d1).

15. The multilayered photosensitive material for the preparation of a flexographic printing plate as claimed in claim 1 in which the thickness of the masking layer (D) is in the range from 0.05 to 20 $\mu$m.

* * * * *